United States Patent [19]
Parsons et al.

[11] Patent Number: 5,834,860
[45] Date of Patent: Nov. 10, 1998

[54] CONTROLLED IMPEDANCE TRANSISTOR SWITCH CIRCUIT

[75] Inventors: Brian Jeremy Parsons, Clifton; Robert John Simpson, Tockington, both of United Kingdom

[73] Assignee: SGS-Thomson Microelectronics Ltd., United Kingdom

[21] Appl. No.: 431,482

[22] Filed: May 1, 1995

Related U.S. Application Data

[63] Continuation of Ser. No. 75,764, Jun. 11, 1993, abandoned.

[30] Foreign Application Priority Data

Nov. 25, 1992 [GB] United Kingdom .................. 9224685

[51] Int. Cl.$^6$ .................................................. H03K 17/16
[52] U.S. Cl. ......................... 307/98; 327/270; 327/391; 327/437; 307/98; 307/104
[58] Field of Search .................... 327/170, 391, 327/437; 307/98, 104

[56] References Cited

U.S. PATENT DOCUMENTS

| 4,985,644 | 1/1991 | Okihara et al. | 307/443 |
|---|---|---|---|
| 5,111,075 | 5/1992 | Ferry et al. | 307/443 |

*Primary Examiner*—William M. Shoop, Jr.
*Assistant Examiner*—Peter Ganjian
*Attorney, Agent, or Firm*—Felsman, Bradley, Gunter, Dillon, LLP

[57] ABSTRACT

An output driver circuit comprises a plurality of parallel pull up and pull down circuits each comprising at least one transistor switch switchable between on and off states and circuitry operable to maintain a desired resistance in the circuit when the transistor switch is switched on, and switch actuating circuitry including time delay circuitry for effecting a sequence of transistor switching operations in said pull-up and pull-down circuits with a time delay between successive operations, each operation effecting simultaneous switching of a transistor in one pull-up circuit and one pull-down circuit, whereby the output impedance is stabilised during a change in signal on the output terminal.

13 Claims, 2 Drawing Sheets

CONTROLLED IMPEDANCE TRANSISTOR SWITCH CIRCUIT

This is a continuation of application Ser. No. 08/075,764, filed Jun. 11, 1993, now abandoned.

The Invention relates to controlled impedance transistor switch circuits including such circuits used for integrated circuit output drivers.

BACKGROUND OF THE INVENTION

To avoid bus connections in computer systems proposals have been made for serial communication of data along a single conducting path between two interconnected computers or integrated circuit chips. Such serial communication of data requires fewer connections in a network of interconnected devices but the higher signal bandwidth required may require such chip to chip interconnections to be treated as transmission lines. To avoid errors due to corruption of data it is desirable to reduce unwanted reflections along such a transmission line. To avoid such reflections it is necessary for the transmission line to have a suitable termination at the source or at the receiving end. When source termination is used at an output driver circuit connected to a transmission line, power consumption may be reduced but problems can arise if the resistance of the output drivers varies during change of output signal when transmitting data along the line. Commonly driver circuits employ a pull-up or pull-down transistor to change the potential on an output terminal to indicate change in signal value. The resistance of such drive transistors is not normally 0 during the switching period. In other words a change in output signal level may be transmitted from an output terminal before the switching transistors have completed the transition to their conducting state. The intermediate resistance during the switching operation may in some cases cause erroneous data or glitches being received at the load end.

It is an object of the present invention to provide an impedance transistor switch circuit in which the effective impedance may be controlled during a switching operation.

SUMMARY OF THE INVENTION

The invention provides a controlled impedance transistor switch circuit comprising an output node, a plurality of parallel pull-up circuits, each connected in parallel between said output node and a supply line of an upper potential, a plurality of parallel pull-down circuits each connected in parallel between said output node and a supply line of lower potential, each of said pull-up and pull-down circuits comprising at least one transistor switch switchable between on and off states and circuitry operable to maintain a desired resistance in the circuit when the transistor switch is switched on, and switch actuating circuitry including time delay circuitry for effecting a sequence of transistor switching operations in said pull-up and pull-down circuits with a time delay between successive operations, each operation effecting simultaneous switching of a transistor in one pull-up circuit and one pull-down circuit.

The invention also provides an output driver circuit for an integrated circuit which circuit comprises an output terminal, a plurality of parallel pull-up circuits each connected in parallel between said output terminal and a supply line of an upper potential, a plurality of parallel pull-down circuits each connected in parallel between said output terminal and a supply line of lower potential, each of said pull-up and pull-down circuits comprising at least one transistor switch switchable between on and off states and circuitry operable to maintain a desired resistance in the circuit when the transistor switch is switched on, and switch actuating circuitry including time delay circuitry for effecting a sequence of transistor switching operations in said pull-up and pull-down circuits with a time delay between successive operations, each operation effecting simultaneous switching of a transistor in one pull-up circuit and one pull-down circuit, whereby the output impedance is stabilised during a change in signal on the output terminal.

Said circuitry may comprise a resistance in series with said transistor switch. Alternatively said circuitry may comprise a feed back circuit to control the on state of the transistor switch to maintain a required resistance through the switch when fully on. In use the output driver circuit may be connected to a serial transmission line to transmit data to a location remote from said output terminal, said pull-up and pull-down circuits having an effective resistance to provide a source termination for the transmission line to prevent reflected signals of a level which would corrupt data transmitted along the line.

Preferably each pull-up and pull-down circuit comprises a transistor in series with a resistive component, having a resistance value substantially greater than the resistance of the transistor when the transistor is fully conducting.

Preferably the switch actuating circuitry has time delay circuitry with a time delay between successive switching operations which is greater than the transition time between on and off states of each transistor switch.

Preferably more than two pull-up circuits and more than two pull-down circuits are provided. Four may be provided.

The invention includes a method of operating a controlled impedance transistor switch circuit having an output node, a plurality of parallel pull-up circuits each connected in parallel between said output node and a supply line of an upper potential and a plurality of parallel pull-down circuits each connected in parallel between said output node and a supply line of lower potential wherein each pull-up and pull-down circuit comprises at least one transistor switch and circuitry to maintain effective resistance when the transistor switch is on, which method comprises effecting a sequence of transistor switching operations with a time delay between successive operations, each operation effecting simultaneous switching of a transistor in one pull-up circuit and one pull-down circuit while not effecting any change in at least one other pull-up and one other pull-down circuit.

The time delay between successive operations may be such that the transistors which are switched in any one switching operation have fully changed conducting states before the next switching operation is commenced.

Preferably each sequence of operations commences with the transistor in each pull-up circuit in a first state and the transistor of each pull-down circuit in an opposite second state and at the end of the sequence the transistor in each pull-up circuit is in said second state and the transistor of each pull-down circuit is in said first state.

The invention includes a method of transmitting data serially from an output terminal of an integrated circuit device to a load through a transmission line wherein the transmission line is source terminated by an output driver circuit which is switched in accordance with the aforesaid method.

The invention includes a plurality of integrated circuit devices having a data path interconnected between two of said devices, said data path comprising a transmission line connected to an output driver circuit of one of said devices, said output driver circuit being as aforesaid.

DESCRIPTION OF THE PREFERRED EMBODIMENTS

Figure 1:
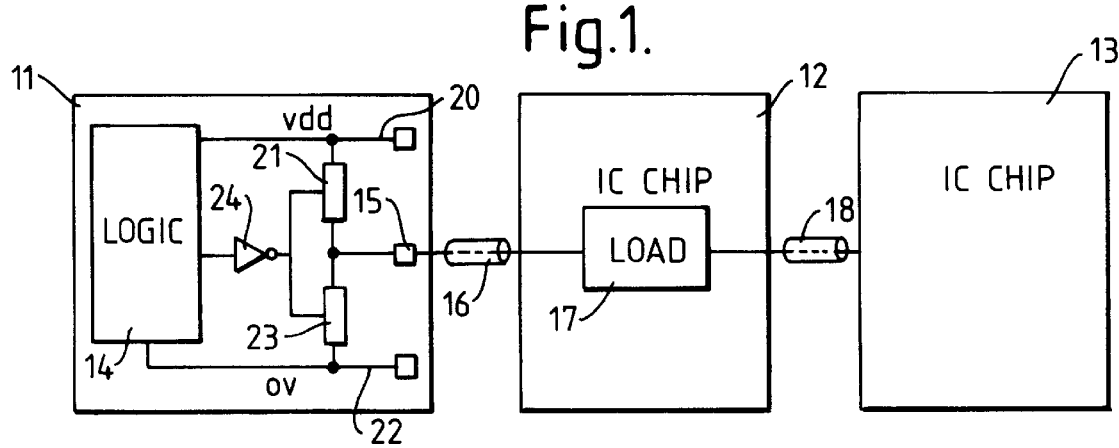
FIG. 1 is a schematic view of a network of integrated circuit chips in accordance with the present invention.

FIG. 1 illustrates a network of interconnected integrated circuit chips such as chips 11, 12 and 13 and in this particular example chip 11 includes a logic circuit 14 which is arranged to transmit data from an output terminal 15 through a transmission line 16 to a load 17 on chip 12. The transmission line 16 is a serial single data wire and a similar transmission line 18 is used to supply data from chip 13 to chip 12. In this example the chips may comprise microcomputers or other integrated circuit chips and for simplicity only the detail of the output driver circuit of chip 11 will be described in more detail. In this case the output terminal 15 is connectable to an upper potential supply line 20 by a switchable pull-up circuit 21. Alternatively the output terminal 15 can be connected to a ground line 22 by a switchable pull-down circuit 23. The operation of the pull-up and pull-down circuits 21 and 23 is controlled by logic gates 24 controlled by the logic circuit 14.

Figure 2:
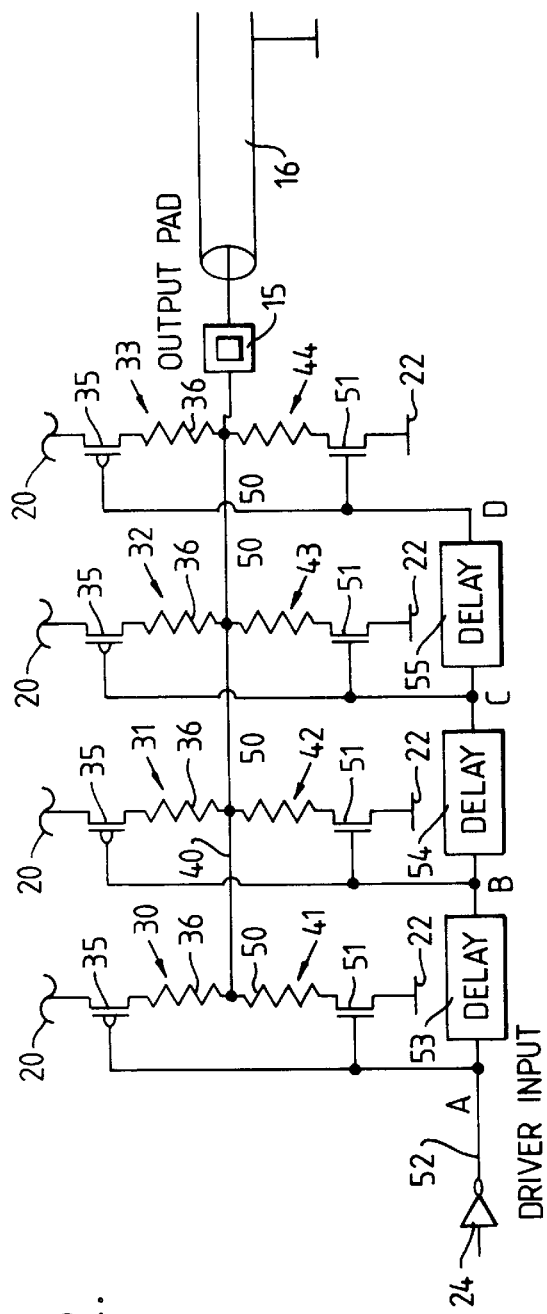
FIG. 2 illustrates in more detail the circuitry of an output driver circuit of one of the chips of FIG. 1.

More details of the pull-up and pull-down circuitry 21 and 23 is illustrated in FIG. 2. The pull-up circuitry 21 comprises four parallel pull-up circuits 30, 31, 32 and 33. Each of these circuits comprises a switching transistor 35 and a serially connected resistor 36. Each of these circuits 30, 31, 32 and 33 is connected in parallel between line 40 connected to the output terminal 15 and the voltage supply line 20. The pull-down circuitry 23 consists of four parallel circuits 41, 42, 43 and 44. Each of the pull-down circuits consists of a resistor 50 connected in series with a switching transistor 51 between line 40 and ground 22.

In this case the logic gates 24 act as switch actuating circuitry in giving a signal on line 52 to change the state of the output signal on the output terminal 15. The switch actuating circuitry includes time delay circuitry which in this case consists of three separate time delay units 53, 54 and 55 connected in line 52. Any change in signal on line 52 is first provided as an input A applied to the pull-up and pull-down circuits 30 and 41. After a time delay determined by delay unit 53 the same signal is applied at point B to the next pair of pull-up and pull-down circuits 31 and 42. After a further time delay determined by delay unit 54 the signal on line 52 is applied at C to the next pair of pull-up and pull-down circuits 32 and 43. After a final time delay determined by delay unit 55 the signal on line 52 is applied at D to the last stage of pull-up and pull-down circuits 33 and 44. Each of the pull-up and pull-down circuits operate in similar manner in that the signal applied at A, B, C or D is applied simultaneously to the gates of the pull-up and pull-down transistors in the respective circuits so as to connect the line 40 to either the voltage supply line 20 and disconnect it from ground or alternatively to connect line 40 to ground and disconnect it from the voltage supply line 20.

Figure 3:
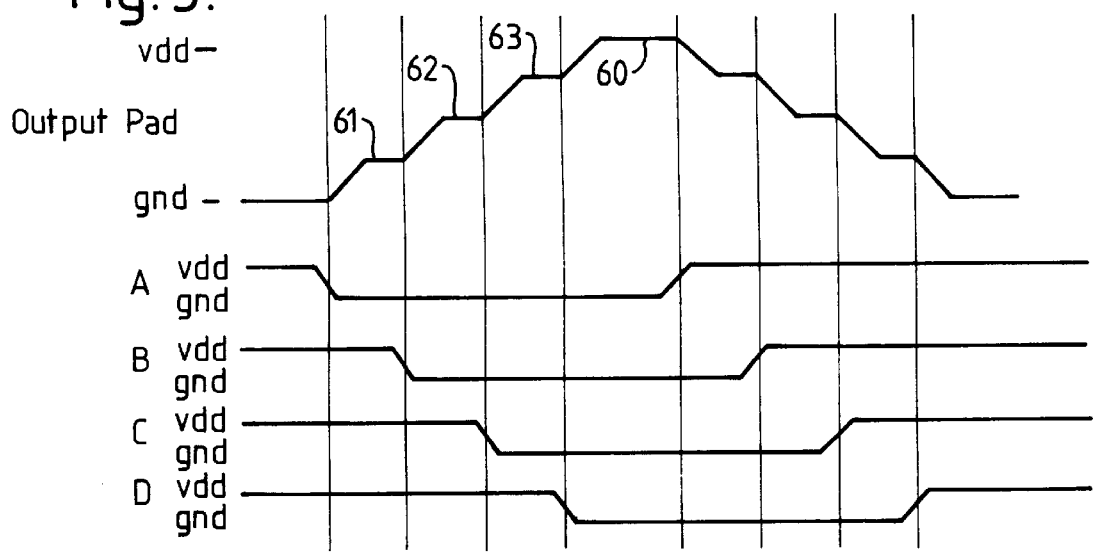
FIG. 3 illustrates signal timing sequences used in FIG. 2.

The effect of one change of signal value on line 52 from 0 to 1 and then back again to 0 is shown in FIG. 3. The voltage on the output pad 15 is shown by line 60 and this increases in steps between the ground potential and VDD as the pull-up and pull-down circuits are successively switched after the appropriate time delays. Initially all four pull-down circuits will be holding the line 40 at ground potential and the pull-up circuits will disconnect line 40 from the upper supply line 20. When the switch actuating signal is input at A the first pair of circuits switches to connect line 40 to the upper potential through pull-up circuit 30 and pull-down circuit 41 becomes open circuited while the three remaining pull-down circuits 42, 43 and 44 retain connection of line 40 to ground. This means that the one connected pull-up circuit 30 acts as a potential divider with the three connected pull-down circuits thereby causing the output pad to rise one step to the position indicated at 61. After the time delay of delay unit 53 the input signal B is actuated as shown in FIG. 3 and the voltage at the output pad changes to level 62 as two pull-up circuits 30 and 31 will now connect line 40 to the upper supply line 20 whereas the two pull-down circuits 43 and 44 will still retain connection of line 40 to the ground line. After operation of the input signal at C, the output voltage at 15 will rise to level 63 as three pull-up circuits will now connect line 40 to the upper supply line 20 and only pull-down circuit 44 will retain connection of line 40 to ground. After the input at D all four pull-up circuits will be connected to the upper supply line 20 and no pull-down circuits will be closed. This will achieve the full output signal at terminal 15 corresponding to the supply line potential. Similarly when the signal on line 52 changes to switch the output from 1 to 0, the switching sequence will be reversed in that circuits 30 and 41 will first be operated to connect line 40 to ground and disconnect it from line 20 whereas the other three circuits will retain their connections to the upper supply line 20. In successive switching operations each of the circuits will be operated to reduce the potential at output terminal 15 to ground in the reverse series of steps already described.

Figure 4:
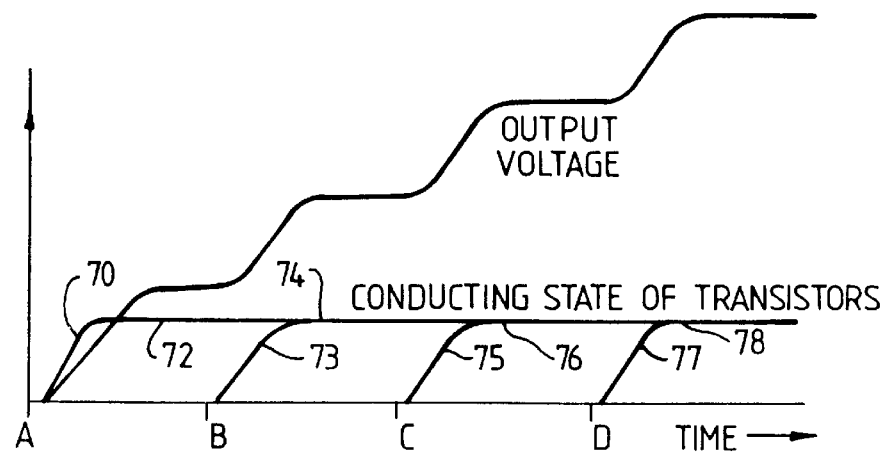
FIG. 4 illustrates the sequence of conduction of transistors used in FIG. 2.

FIG. 4 illustrates the operation of each of the pull-up and pull-down stages during the change in output voltage from 0 to that of the supply line 20. In FIG. 4 the signal to output a value 1 is input initially at A and after a short time interval transistors 35 and 51 begin to change their conducting state as shown by the line 70 in FIG. 4. When transistors 35 and 51 have reached the fully changed conducting condition this is illustrated by the horizontal section 72. A short time after input of signal at B transistors 35 and 51 gradually change their conducting state as shown by line 73 and reach a fully changed conducting state at 74. Similarly after input of signal at C transistors 35 and 51 gradually change state as indicated at 75 and reach a fully changed conducting state at 76. After input of signal at D transistors 35 and 51 gradually change conducting state as marked at 77 and reach a fully changed conducting state at 78. The time delays operated by units 53, 54 and 55 are arranged such that signals B, C and D are only supplied to the respective transistors after the transistors of the preceding stage have already fully changed conducting state. In this example the conducting state of the pair of transistors of any stage has fully changed before the transistors of a subsequent stage start to change their conducting stage. This is ensured by suitable arrangement of the time intervals between signals A, B, C and D in relation to the time taken for each of the transistors to change fully from one conducting state to the other.

It will be appreciated that by arranging to switch the output voltage in a time delayed sequence of stages, the rate of change of current in the output driver circuit is controlled so as to avoid excessive rates of change of current in the output drivers which might cause excessive glitches or bounce in the supply.

Furthermore, the value of the resistors 36 and 50 are arranged to be substantial in relation to the resistance of the transistors 35 and 51 when switched on. In some examples the resistors 36-50 have the same values but in some embodiments the resistors 36 may have a different value from the resistors 50. It will be appreciated that once each of the transistors 35 or 51 starts to become conducting during a switching operation to make that transistor conduct it will cause some change in the output voltage as is illustrated in the curve shown in FIG. 4 well before the transistor has fully changed to its other conducting state. In other words once it starts to allow some conduction the output voltage may change while the resistance of the transistor is still varying between its two extreme states of conduction. However due to the series location of the substantial resistance 36 or 50 the overall change in resistance seen by the output terminal 15 and the transmission line 16 is very small during the intermediate states of switching of any of the transistors 35 or 51. Consequently by arranging to switch the output signal in a sequence of delayed switching operations, each switching operation being carried out through a resistive circuit in series with the switching transistor, it is possible to stabilise substantially the output resistance forming the source termination of the transmission line 16.

The values of the resistors 36 and 50 are selected to maintain the output resistance within predetermined limits for the respective directions of voltage transition on the output pad 15 so as to avoid unwanted reflections of data transmission through the transmission line 16. It will be appreciated that the data transmitted from the output pad 15 will in this case be a sequence of serial data bits and the resistor values are chosen to cause a substantial reduction in reflections so that any reflected voltage levels are below the threshold value where they would be interpreted as a change in signal value either on moving to a high signal value 1 or alternatively to the ground value.

The fluctuation of output resistance does of course occur during the time that the switching transistors are in a state of transition between two conducting states and the transistors preferably have a minimum transition time for switching between their two alternative conducting states in order to reduce to a minimum the time which any mismatch in the output impedance may occur.

Figure 5:
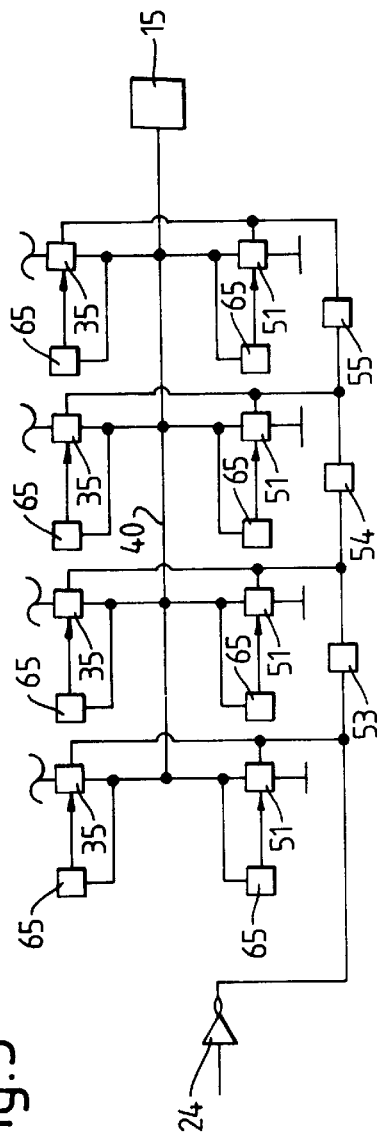
FIG. 5 illustrates an alternative arrangement for the pull-up and pull-down circuits.

The invention is not limited to the details of the foregoing example. For example the resistors 36 and 50 may be replaced by other effective resistance components such as transistor circuits having acceptable resistive value in series with the switching transistors. Alternatively the arrangement shown in FIG. 5 may be used. In this example similar reference numerals have been used for components similar to those of FIG. 2. In this case the resistors 36 and 50 have been omitted and the serial resistance of the transistors 35 and 51 is controlled in the on state by feed back circuits 65. In this case the transistors 35 and 51 are CMOS devices having high impedance in the off state and when switched on they may retain a lower resistance equivalent to that provided by resistors 36 and 50 by the feed back circuits 65 coupled to the pull-up and pull-down circuits and controlling the gate signals of the transistors.

We claim:

1. A controlled impedance transistor switch circuit comprising an output node on a conducting line, a plurality of parallel pull-up circuits, each connected in parallel with a first connection to said output node and a second connection to a supply line of an upper potential, a plurality of parallel pull-down circuits each connected in parallel with a first connection to said output node and a second connection to a supply line of lower potential, each of said pull-up and pull-down circuits comprising at least one transistor switch switchable between on and off states and resistance control circuitry operable to maintain in the circuit a substantial serial resistance between said first and said second connections when the transistor switch is switched on, and switch actuating circuitry including time delay circuitry for effecting both a time delayed sequence of transistor switching on operations and a time delay sequence of transistor switching off operations in said pull-up and pull-down circuits, each switching operation effecting simultaneous switching of a transistor in one pull-up circuit and one pull-down circuit, wherein a substantial resistance is established both between the supply line of upper potential and said conducting line and between the supply line of lower potential and said conducting line to stablise impedance at said output node during each switching operation.

2. An output driver circuit for an integrated circuit which circuit comprises an output terminal on a conducting line, a plurality of parallel pull-up circuits each connected in parallel with a first connection to said output terminal and a second connection to a supply line of an upper potential, a plurality of parallel pull-down circuits each connected in parallel with a first connection to said output terminal and a second connection to a supply line of lower potential, each of said pull-up and pull-down circuits comprising at least one transistor switch switchable between on and off states and resistance control circuitry operable to maintain in the circuit a substantial serial resistance between said first and said second connections when the transistor switch is switched on, and switch actuating circuitry including time delay circuitry for effecting both a time delayed sequence of transistor switching on operations and a time delayed sequence of transistor switching off operations in said pull-up and pull-down circuits, each switching operation effecting simultaneous switching of a transistor in one pull-up circuit and one pull-down circuit, wherein a substantial resistance is established both between the supply line of upper potential and said conducting line and between the supply line of lower potential and said conducting line to stablise the output impedance during each switching operation.

3. An output driver circuit according to claim 2, connected to a serial transmission line to transmit data to a location remote from said output terminal, said pull-up and pull-down circuits having an effective resistance to provide a source termination for the transmission line to prevent reflected signals of a level which would corrupt data transmitted along the line.

4. A circuit according to claim 2 in which said time delay circuitry provides a time delay between each switching operation which is greater than the transition time between on and off states of each transistor switch.

5. A circuit according to claim 2 in which said circuitry to maintain a desired resistance comprises a resistive element in series with the transistor switch.

6. A circuit according to claim 2 in which said circuitry operable to maintain a desired resistance comprises feed back circuitry coupled to the transistor switch to provide a gate signal controlling resistance of the transistor switch in the on state.

7. A circuit according to claim 2 in which each pull-up and pull-down circuit comprises a transistor in series with a resistive component, the resistive component having a resistance value substantially greater than a resistance of the transistor when the transistor is fully conducting.

8. A circuit according to claim 2 in which more than two pull-up circuits and more than two pull-down circuits are provided.

9. A method of operating a controlled impedance transistor switch circuit having an output node on a conducting line, a plurality of parallel pull-up circuits each connected in parallel with a first connection to said output node and a second connection to a supply line of an upper potential and a plurality of parallel pull-down circuits each connected in parallel with a first connection to said output node and a second connection to a second supply line of lower potential wherein each pull-up and pull-down circuit comprises at least one transistor switch and resistance control circuitry to maintain in the circuit a substantial serial resistance between said first and second connections when the transistor switch is on, which method comprises effecting a sequence of transistor switching operations with a time delay between successive operations both switching on and switching off said transistor switches, each switching operation effecting simultaneous switching of a transistor in one pull-up circuit and one pull-down circuit while not effecting any change in at least one other pull-up and one other pull-down circuit, wherein a substantial resistance is established both between the supply line of upper potential and said conducting line and between the supply line of lower potential and said conducting line to stablise impedance at the output node during each switching operation.

10. A method according to claim 9 in which the time delay between successive switching operations is such that the transistors which are switched in any one switching operation have fully changed conducting states before the next switching operation is commenced.

11. A method according to claim 9 in which each sequence of operations commences with the transistor in each pull-up circuit in a first state and the transistor of each pull-down circuit in an opposite second state and at an end of the sequence the transistor in each pull-up circuit is in said second state and the transistor of each pull-down circuit is in said first state.

12. A method of transmitting data serially from an output terminal on a conducting line of an integrated circuit device to a load through a transmission line wherein the transmission line is source terminated by an output driver circuit having an output node, a plurality of parallel pull-up circuits each connected in parallel with a first connection to said output node and a second connection to a supply line of an upper potential and a plurality of parallel pull-down circuits each connected in parallel with a first connection to said output node and a second connection to a supply line of lower potential wherein each pull-up and pull-down circuit comprises at least one transistor switch and resistance control circuitry to maintain a substantial serial resistance between said first and second connections when the transistor switch is on, which method comprises effecting a sequence of transistor switching operations with a time delay between successive operations both switching on and switching off said transistor switches, each switching operation effecting simultaneous switching of a transistor in one pull-up circuit and one pull-down circuit while not effecting any change in at least one other pull-up and one other pull-down circuit, wherein a substantial resistance is established between the supply line of upper potential and said conducting line and between the supply line of lower potential and said conducting line to stablise impedance at the output node during each switching operation when the transistor switch is switched on.

13. A plurality of integrated circuit devices having a data path interconnected between two of said devices, said data path comprising a transmission line connected to an output driver circuit of one of said devices, said output driver circuit comprising an output terminal on a conducting line, a plurality of parallel pull-up circuits each connected in parallel with a first connection to said output terminal and a second connection to a supply line of an upper potential, a plurality of parallel pull-down circuits each connected in parallel with a first connection to said output terminal and a second connection to a supply line of lower potential each of said pull-up and pull-down circuits comprising at least one transistor switch switchable between on and off states and resistance control circuitry operable to maintain in the circuit a substantial serial resistance between said first and second connections when the transistor switch is switched on, and switch actuating circuitry including time delay circuitry for effecting both a time delayed sequence of transistor switching on operations and a time delayed sequence of transistor switching off operations in said pull-up and pull-down circuits, each switching operation effecting simultaneous switching of a transistor in one pull-up circuit and one pull-down circuit, wherein a substantial resistance is established both between the supply line of upper potential and said conducting line and between the supply line of lower potential and said conducting line to stablise impedance at the output terminal during each switching operation.

* * * * *